(12) United States Patent
Goto

(10) Patent No.: US 7,115,839 B2
(45) Date of Patent: Oct. 3, 2006

(54) HEATERS

(75) Inventor: Yoshinobu Goto, Nagoya (JP)

(73) Assignee: NGK Insulators, Ltd., Nagoya City (JP)

(*) Notice: Subject to any disclaimer, the term of this patent is extended or adjusted under 35 U.S.C. 154(b) by 0 days.

(21) Appl. No.: 11/024,245

(22) Filed: Dec. 28, 2004

(65) Prior Publication Data

US 2005/0173413 A1   Aug. 11, 2005

(30) Foreign Application Priority Data

Jan. 9, 2004   (JP) ............................. P2004-004069

(51) Int. Cl.
*H05B 3/68* (2006.01)
*C23C 16/00* (2006.01)

(52) U.S. Cl. ................................. 219/444.1; 118/724

(58) Field of Classification Search ............. 219/444.1, 219/462.1, 483, 544, 543, 541; 118/724, 118/725
See application file for complete search history.

(56) References Cited

U.S. PATENT DOCUMENTS

| 5,338,919 | A | * | 8/1994 | Tagashira et al. ............ 219/543 |
| 5,966,577 | A | * | 10/1999 | Abe ............................ 399/320 |
| 6,392,205 | B1 | * | 5/2002 | Minonishi ................. 219/443.1 |
| 6,664,515 | B1 | * | 12/2003 | Natsuhara et al. ....... 219/444.1 |

FOREIGN PATENT DOCUMENTS

JP        6-53145        2/1994

* cited by examiner

*Primary Examiner*—Sang Paik
(74) *Attorney, Agent, or Firm*—Burr & Brown

(57) ABSTRACT

A heater is provided, including an insulating substrate and a heating resistance, wherein the temperature on the heating face is easily controlled without providing a separate temperature controlling member. The heating resistance includes at least one parallel-connected portion which includes a plurality of heat generating parts connected in parallel. At least one of the heat generating portions has a resistance adjusting means.

14 Claims, 8 Drawing Sheets

(a)

(b)

(a)

(b)

HEATERS

This application claims the benefit of Japanese Patent Application P2004-4069, filed on Jan. 9, 2004, the entirety of which is incorporated by reference.

BACKGROUND OF THE INVENTION

1. Field of the Invention

The present invention relates to heaters.

2. Related Art Statement

In systems for producing semiconductors, ceramic heaters have been used to heat a wafer (substrate) so as to deposit a semiconductor thin film on the wafer from gaseous raw materials such as silane gas by means of thermal CVD or the like. In such heaters, it is necessary to maintain a high temperature on the heating face and to assure the uniformity of the temperature on the heating face so as to prevent semiconductor defects. Such ceramic heaters, however, are generally made of a ceramic substrate and a heat generator embedded in the substrate, so that some degree of temperature difference is usually observed on the heating face.

Japanese patent publication 6-53, 145 A discloses a technique for improving the temperature uniformity on the semiconductor heating face of a ceramic heater. That is, a disk-shaped ceramic heater with a heating face for heating a semiconductor is produced. The temperature distribution on the heating face is then observed with a thermograph. The thus observed temperature distribution is then subjected to image processing to obtain image-processed data. A reflector is provided on a position opposing the back face of the ceramic heater. Heat radiated from the back face of the ceramic heater is reflected by the reflector and irradiated into the heater again. The temperature distribution of the reflector is controlled based on the image-processed data. In a region where a lower temperature is observed on the heating face, the thermal absorptance of the reflector is reduced, so that heat reflected by the reflector into the heater may be increased. The temperature in the region with a lower temperature observed can thus be increased. The surface of the reflector is subjected to sandblasting to control the surface roughness and to thus control the reflectance of the reflector.

The inventor has studied the above technique in Japanese patent publication 6-53, 145 A and has encountered the following problems. That is, it is necessary to fix a reflector in a specific position opposing the back surface of the heater in a semiconductor chamber. After fixing the reflector, the distribution of the thermal absorptance (or thermal reflectance) on the reflecting face of the reflector needs to be accurately matched with the temperature distribution on the heating face of the ceramic heater before fixing the reflector. It is difficult, however, to adjust the positions of the heating face of the heater and of the reflecting face of the reflector, for the following reasons:

(1) The center of the circular heating face of the ceramic heater needs to be accurately matched with the center of the circular reflecting face of the reflector; and (2) The angle and diameter of each position of the heating face with respect to the center needs to be accurately matched with those of each position of the reflecting face with respect to the center.

Furthermore, even if such adjustments of the two-dimensional position are successfully performed, such adjustments are insufficient for obtaining temperature uniformity on the heating face within a particular specification for the following reasons. That is, the distance between the back face of the heater and the reflecting face of the reflector is also important. Specifically, the thermal absorptance of each point on the reflecting face is calculated and designed on the provision that a distance between the reflecting face and the back face of the heater is a specific value "α." When the distance between the reflecting face and back face is smaller than "α," heat transmitted from the reflecting face to the back face of the heater is increased so that the temperature on the heating face of the heater may be increased. The following adjustments (3) and (4) are thus needed:

(3) To control the distance between the back face of the heater and the reflecting face of the reflector at a specific value "α"; and (4) To make the back face of the heater and the reflecting face parallel with each other over the entire back face.

It may be difficult to set and fix the reflector in a semiconductor chamber while maintaining the above four geometrical conditions. Furthermore, a fixed reflector may require a complicated structure, which may cause deterioration of the reflector, fracture or warping of the reflector due to thermal stress and may have an adverse effect on the flow of process gas.

SUMMARY OF THE INVENTION

An object of the present invention is to provide a heater having an insulating substrate and a heating resistance so that the temperature on the heating face can be easily controlled without providing a temperature controlling member that is separate from the insulating substrate.

The present invention provides a heater comprising a substrate comprising an insulating material and a heating resistance provided in or on said substrate, wherein said heating resistance comprises a parallel-connected portion comprising a plurality of heat generating parts connected in parallel.

According to the present invention, a parallel-connected portion having a plurality of heat generating parts connected in parallel is provided in the heating resistance. It is thus possible to enlarge the area where the heat generating parts are provided, while assuring a heating value comparable to that of a heating resistance connected in serial. Such a heating resistance is thus advantageous to assure the temperature uniformity on the heating face of the substrate.

According to a preferred embodiment, the resistance value of at least one of the heat generating parts is adjusted. Further, in a preferred embodiment, a resistance adjusting means is provided for adjusting the resistance value of the heating resistance. It is thus possible to obtain the desired temperature distribution on the heating face as described below.

For example, when a cold spot is observed on the heating face of a substrate, the resistance value of a specific heat generating part in a region directly under the cold spot is selected to be adjusted, for example, a resistance adjusting means of the selected heat generating part is processed to raise the resistance value of the whole parallel-connected portion to increase the heating value. It is thus possible to cancel or reduce the cold spot.

On the other hand, when a hot spot is observed on the heating face of a substrate, the resistance value of a specific heat generating part in a region directly under the hot spot is selected to be adjusted, for example, a resistance adjusting means of the heat generating part is processed to lower the resistance value of the whole parallel-connected portion to reduce the heating value. It is thus possible to cancel or reduce the hot spot.

BRIEF DESCRIPTION OF THE DRAWINGS

These and other objects, features and advantages of the invention will be appreciated upon reading the following description of the present invention when taken in conjunction with the attached drawings, with the understanding that some modifications, variations and changes of the same could be made by the skilled person in the art.

FIG. 2 (b) is a cross-sectional view schematically showing the heat generating part.

FIG. 3 (b) is a plan view showing a parallel-connected portion 6A wherein heat generating part 6a is disconnected.

FIG. 6 (b) is a plan view showing a parallel-connected portion 6A wherein heat generating part 6c is connected.

DETAILED DESCRIPTION OF THE INVENTION

According to a preferred embodiment, the heating resistance includes a plurality of parallel-connected portions. It is thus possible to respond to and correct hot and cold spots observed at the different positions on the heating face.

The kind of resistance adjusting means is not particularly limited. According to one embodiment, the resistance adjusting means is made of an insulating material having a higher resistance value than that of the heat generating part, so that at least a part of the heat generating part can be contacted with the insulating substrate to disconnect the heat generating part.

Further, according to another, preferred embodiment, the resistance adjusting means comprises a conductor that is removable from and attachable to the substrate. The conductor can be inserted into a space formed between the heat generating parts to lower the resistance value of a heat generating part or to connect them. Further, the conductor can be removed from the space to increase the resistance value of the heat generating parts or disconnect them.

Further, it is not indispensable to fit the resistance adjusting means to the heating resistance. For example, a part of the heating resistance is denatured, or a conductive material is applied onto the heating resistance, or a conductive material is applied on the side of the heating resistance to change the resistance value as a whole, so that the heating value is adjusted.

According to a preferred embodiment, the resistance values of the heat generating parts in the parallel-connected portion are different from each other. In this case, a change in the heating value when one heat generating part is disconnected and that when the other heat generating part is disconnected are different from each other. Further, a change in the heating value when one heat generating part is connected and that when the other heat generating part is connected are different from each other. It is thus possible to select an appropriate one of the heat generating parts from among the plurality of the heat generating parts and adjust the resistance value, responsive to the dimension of hot and cold spots and the temperature difference between the hot or cold spot and a region surrounding the spot. The method of adjustment is advantageous because a wide variety of the hot or cold spots can be cancelled or reduced.

EXAMPLES

Figure 1:
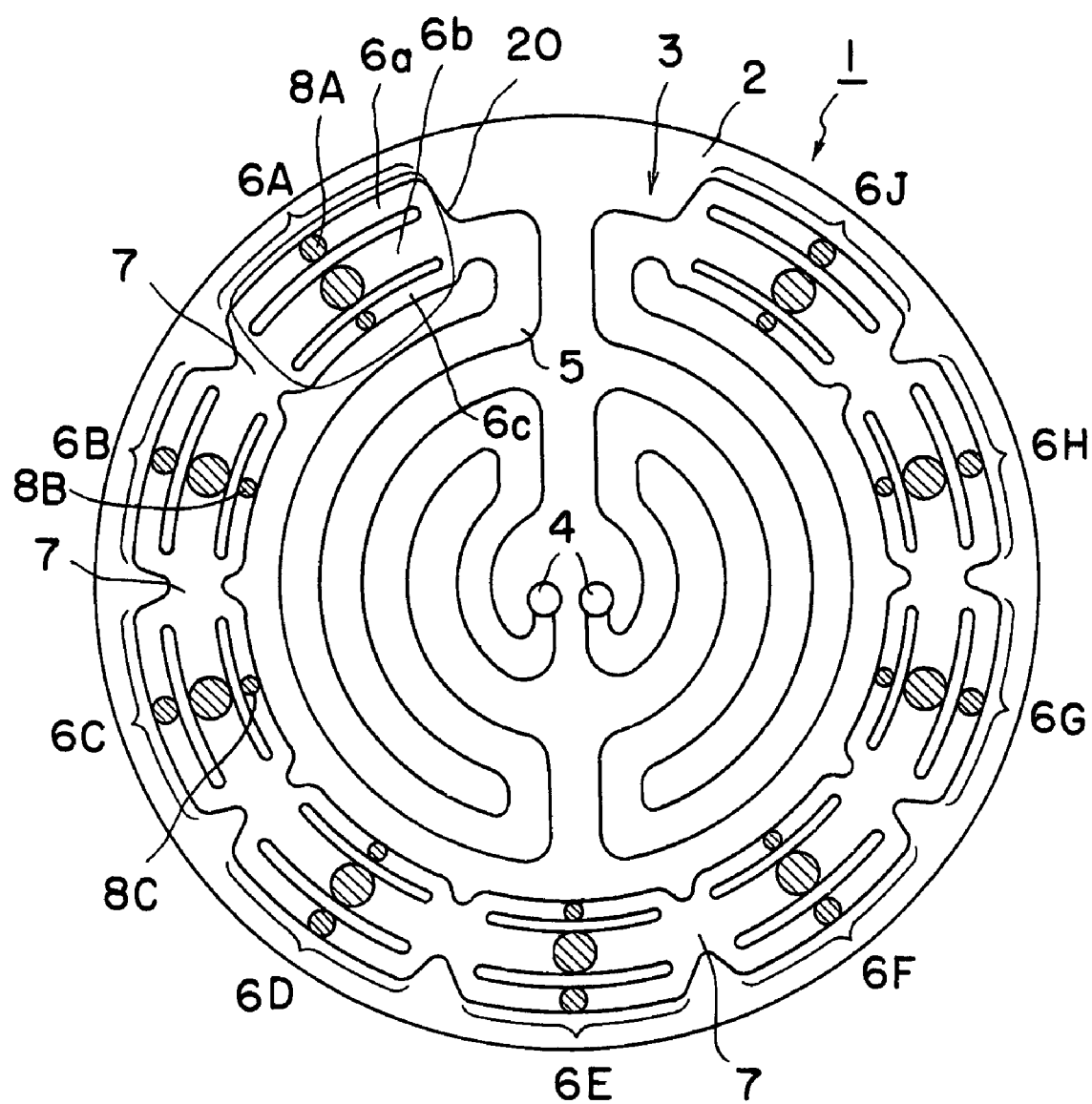
FIG. 1 is a plan view showing an example of pattern of a heating resistance 3 of a heater 1 according to one embodiment of the present invention.
Figure 2:
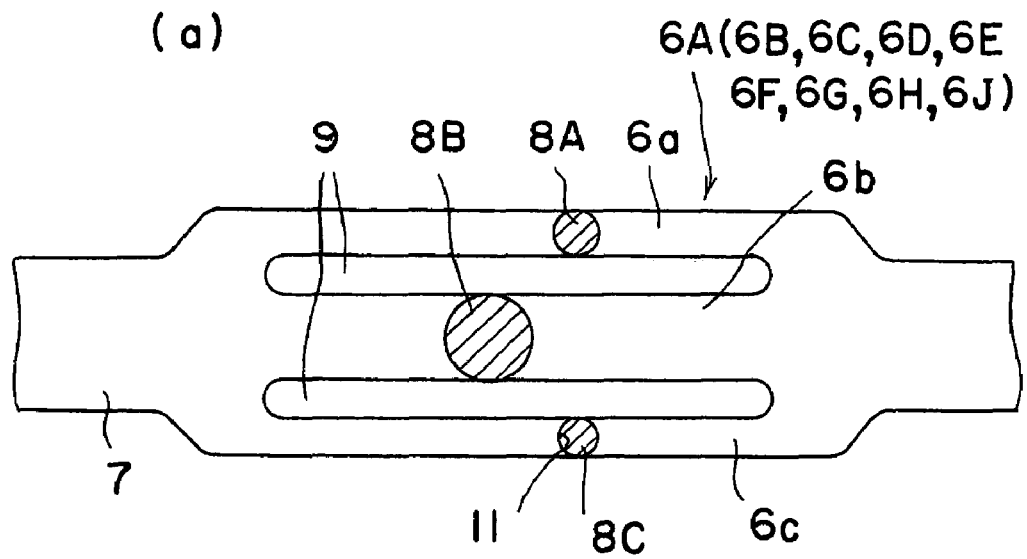
FIG. 2 (a) is a plan view showing parallel-connected portions 6A to 6J.
Figure 2:
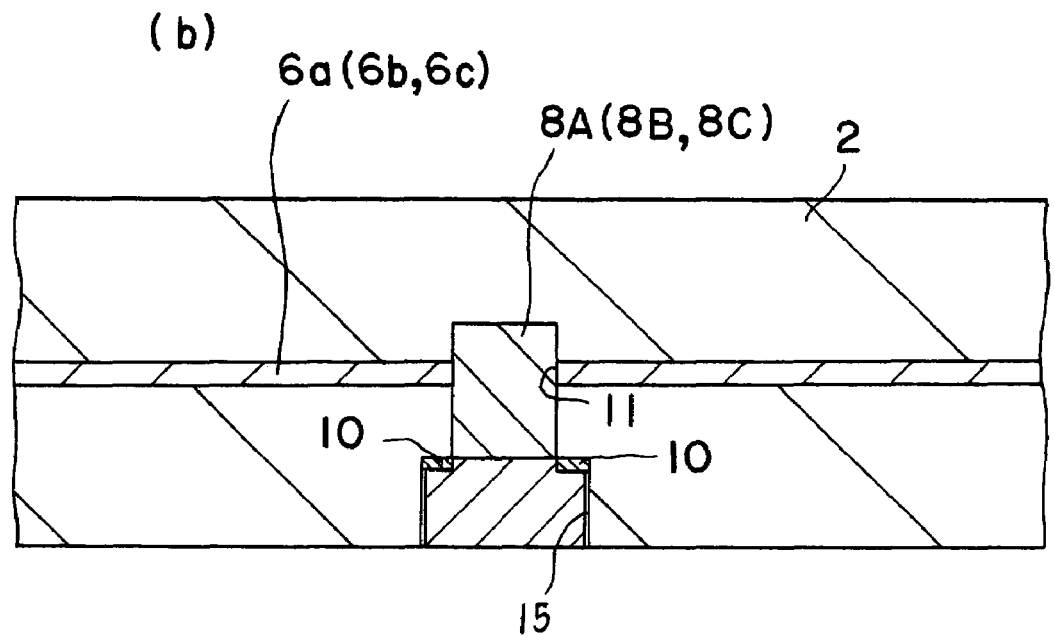

FIG. 1 is a plan view showing pattern of a heating resistance of a heater 1 according to one embodiment of the present invention. FIG. 2 (a) is a plan view showing parallel-connected portions 6A to 6J, and FIG. 2 (b) is a cross-sectional view schematically showing resistance adjusting means 8A, 8B and 8C in each of the parallel-connected portions.

A heating resistance 3 is provided in a substrate 2 of a heater 1. The heating resistance 3 may be embedded in the substrate 2 as shown in FIG. 2 (b). Alternatively, the heating resistance 3 may be provided on the surface of the substrate 2. According to the present example, the heating resistance 3 is formed between a pair of terminals 4. The pair of terminals 4 are electrically connected through a spiral portion 5 and parallel-connected portions 6A, 6B, 6C, 6D, 6E, 6F, 6G, 6H and 6J. The parallel-connected portions 6A to 6J are positioned in the outer peripheral part of the substrate 2 so that the portions together form a substantially circular pattern. Adjacent parallel-connected portions are connected with each other through a serial-connecting portion 7.

Parallel-connected portions 6A to 6J are provided between the adjacent serial-connecting portions 7, respectively. According to the present example, each parallel-connected portion is divided into three heat generating parts 6a, 6b and 6c. The line widths of the heat generating parts 6a, 6b and 6c are different from each other, so that the resistances and heating values of the different heat generating parts are different from each other. The heat generating part 6a is provided in an outermost position, and heat generating parts 6b and 6c are provided in order toward the center of the heating face.

A resistance adjusting means is provided in each of the heat generating parts 6a, 6b and 6c. The resistance adjusting means may be a removable and attachable conductor or insulator as described above. According to the present example, the heating resistance 3 is embedded in the substrate 2, and removable and attachable conductors 8A, 8B and 8C are attached to the substrate 2 so that the heat generating parts 6a, 6b and 6c are electrically conducted. For example, screw holes 15 are formed in the substrate 2, and through holes 11 are formed in the respective heat generating parts 6a, 6b and 6c, so that the through holes 11 communicate with the screw holes 15, respectively. Conductors 8A, 8B and 8C, each having a screw portion, are inserted into the screw holes 15 and fixed in the holes with a solder 10 so that the heat generating parts 6a, 6b and 6c electrically contact the respective conductors 8A, 8B and 8C. In addition, spaces 9 are formed between adjacent heat generating parts 6a and 6b and between 6b and 6c.

When the heater is produced, the conductors 8A, 8B and 8C are inserted into the respective screw holes so that the heat generating parts 6a, 6b and 6c are electrically conducted. The heater 1 is set in a predetermined position and the temperature distribution on the heating face is then observed. Preferably, the heater is set in an environment for actual use or a similar environment before the temperature distribution on the heating face is measured. The method of measuring the temperature distribution is not particularly limited. For example, a measuring device is set on the heating face to measure the temperature distribution on the heating face. The results of the measurement are sent to a processor to perform image processing and the thus obtained results are sent to a displaying device for image projection.

When a cold or hot spot not satisfying the specification for the heater is observed on the heating face, the following steps should occur. Such a cold or hot spot may be observed in a shape of an arc as shown as an arrow 20 in the peripheral portion in the pattern of the substrate shown in FIG. 1 in many cases. In this case, it is necessary to raise the resistance value of the parallel-connected portion (for example 6A) nearest to the cold spot to increase the heating value. For this, the conductor 8A, 8B or 8C is removed or the contact resistance value between the conductor and resistance pattern is raised to increase the resistance of heat generating parts 6a, 6b and 6c so that the overall heating value is appropriately elevated.

Figure 3:
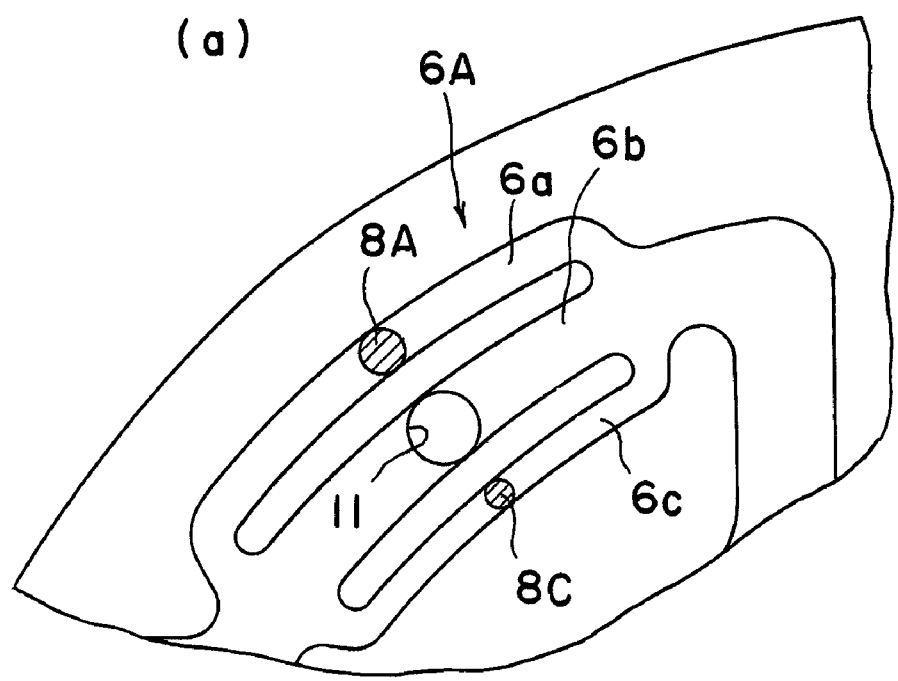
FIG. 3 (a) is a plan view showing a parallel-connected portion 6A wherein heat generating part 6b is disconnected.
Figure 3:
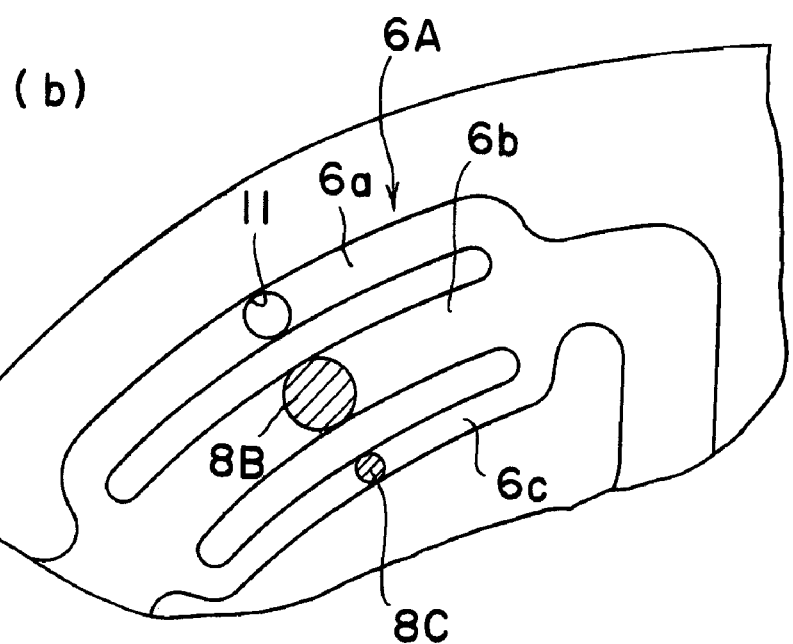

For example, as shown in FIG. 3 (a), the conductor 8B is removed to disconnect or raise the resistance value of the heat generating part 6b. As a result, the overall resistance value of the parallel-connected portion 6A is raised to elevate the heating value from the parallel-connected portion 6A, so that cold spot in a region over or near the parallel-connected portion 6A can be cancelled or reduced. Alternatively, as shown in FIG. 3 (b), the conductor 8A is removed to disconnect or raise the resistance value of the heat generating part 6a. As a result, the overall resistance value of the parallel-connected portion 6A is raised to elevate the heating value from the parallel-connected portion 6A, so that cold spot in a region over or near the parallel-connected portion 6A can be cancelled or reduced.

Figure 4:
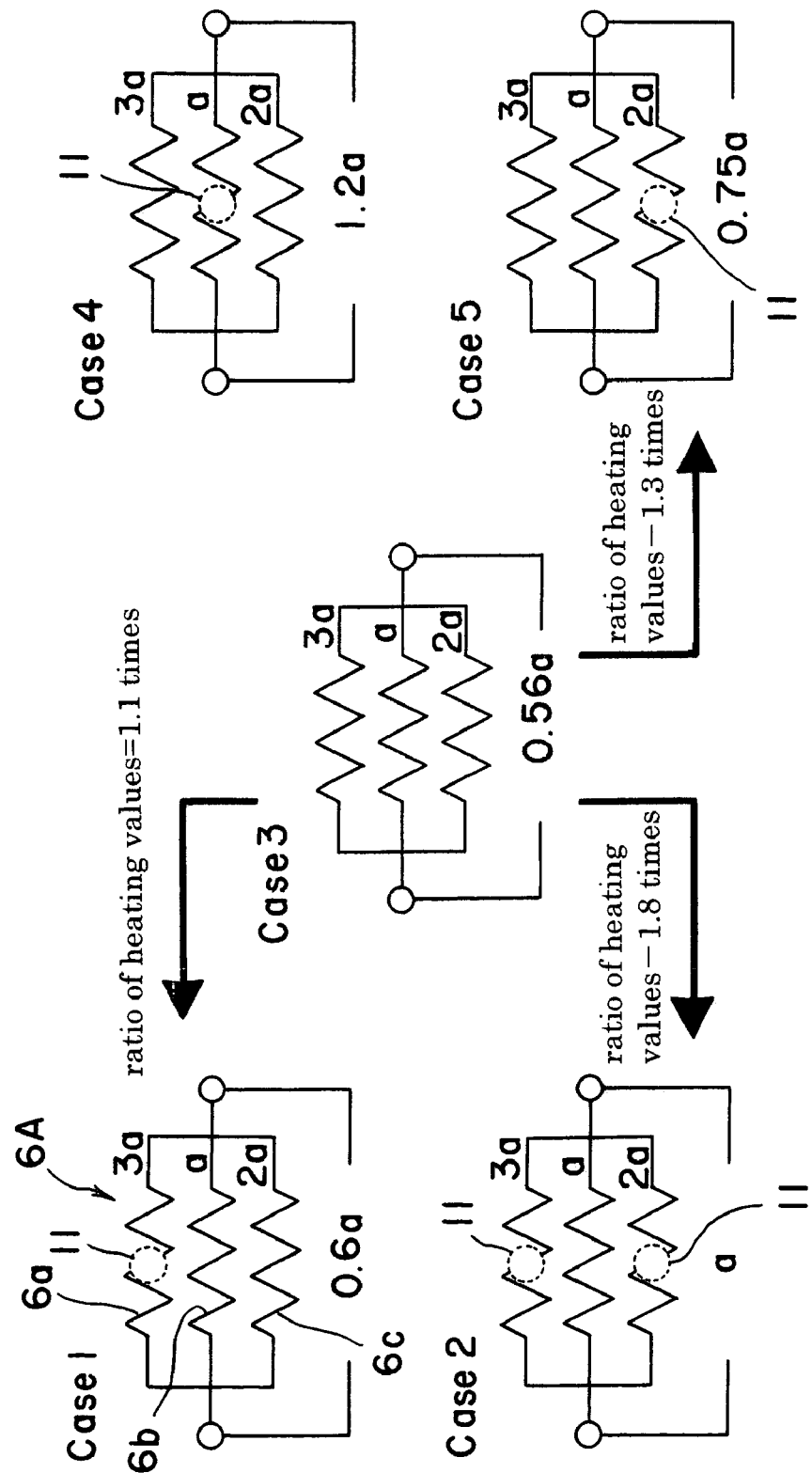
FIG. 4 is a conceptual diagram explaining the relationship between the heat generating part selected for disconnection and the resistance value of the parallel-connected portion.

The parallel-connected portion 6A is taken as an example to show the ratios of resistance and heating values when the heat generating part 6a, 6b or 6c is disconnected. As shown in FIG. 4, it is provided that the ratio of the resistance values of the heat generating parts 6a, 6b and 6c is changed to 3a:a:2a. According to "Case 3," all the heat generating parts 6a, 6b and 6c are normally connected and the overall resistance value of the parallel-connected portion is 0.56 a. If only the heat generating part 6a is disconnected (Case 1), the overall resistance value of the parallel-connected portion 6A becomes 0.6 a whose heating value is made 1.1 times larger than that in the Case 3. If only the heat generating part 6b is disconnected (Case 4), the overall resistance value of the parallel-connected portion 6A becomes 1.2 a. If only the heat generating part 6c is disconnected (Case 5), the overall resistance value of the parallel-connected portion 6A becomes 0.75 a. If both of the heat generating parts 6a and 6c are disconnected (Case 2), the overall resistance value of the parallel-connected portion 6A becomes 1 a whose resistance and heating value are 1.8 times larger than those in the Case 3. The ratio of the increase in the heating value can be adjusted appropriately by selecting the heat generating part to be disconnected.

According to the above example, the resistance adjusting means for the heat generation parts in the parallel-connected portion are connected as shown in FIG. 1 to minimize the resistance values of the heat generating parts. The specific heat generating part or parts of the parallel-connected portion is selected and the resistance value is raised, corresponding to the position of the observed cold spot on the heating face. Alternatively, one or more of the heat generating parts of the parallel-connected portion may be disconnected in advance. In this case, hot spots on the heating face are observed. A specific heat generating part of the parallel-connected portion is selected in a region directly under or near the hot spot and electrically connected to lower the resistance and heating values of the parallel-connected portion so that the hot spot is cancelled or prevented.

Figure 5:
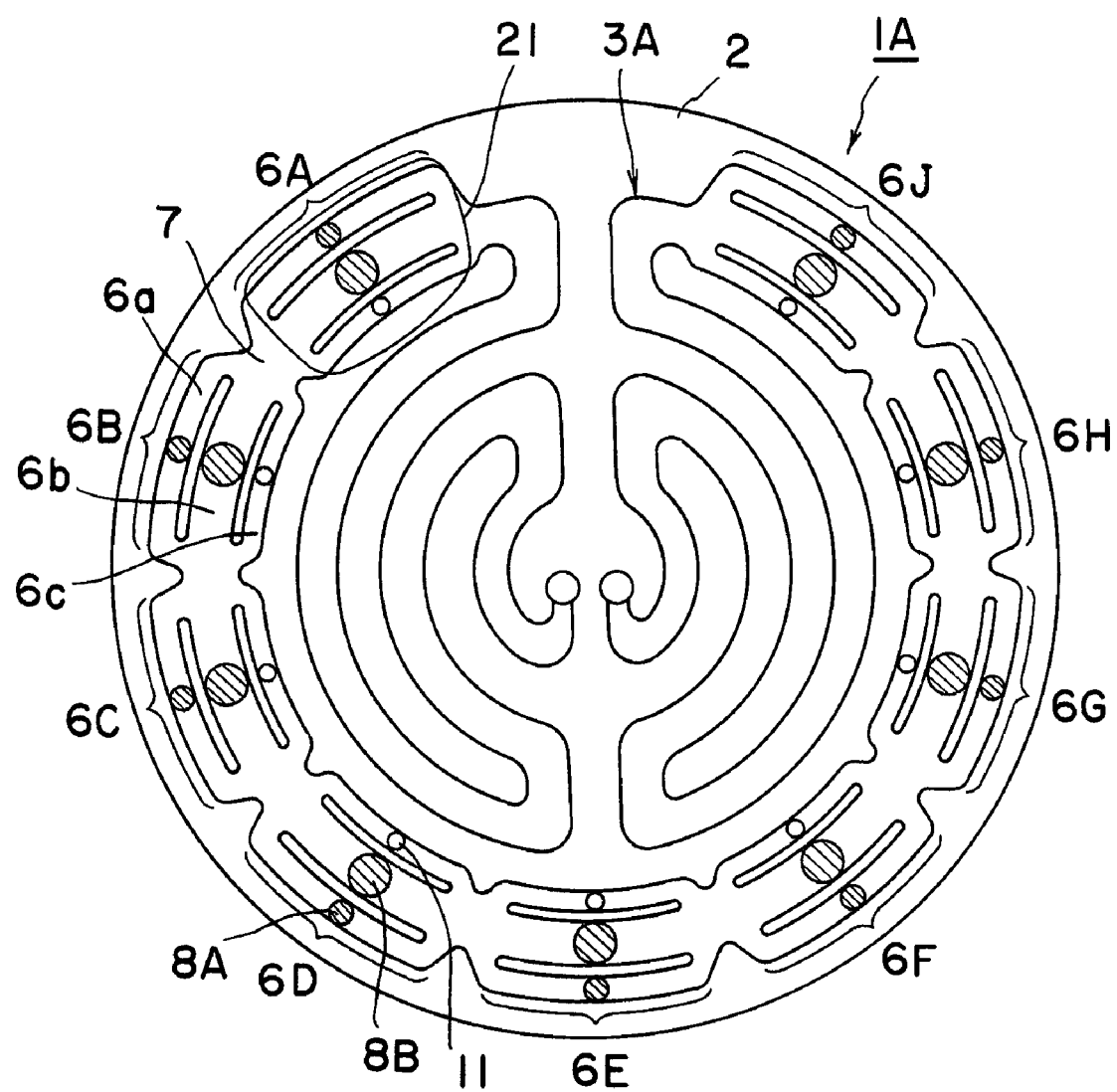
FIG. 5 is a plan view showing an example of pattern of a heating resistance 3A of a heater 1A according to another embodiment of the present invention.
Figure 6:
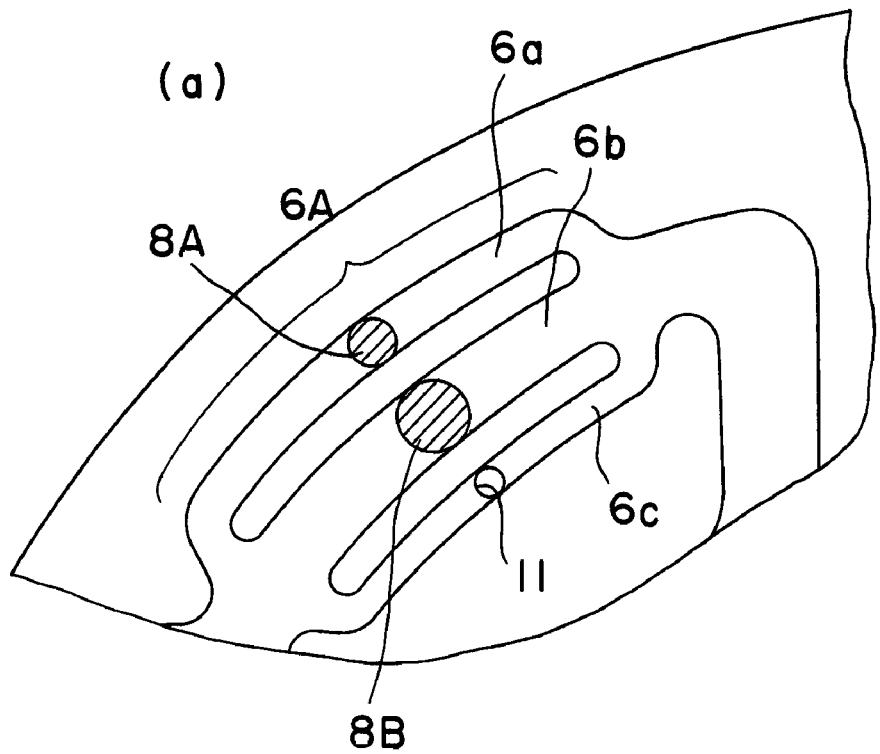
FIG. 6 (a) is a plan view showing a parallel-connected portion 6A wherein heat generating part 6c is disconnected.
Figure 6:
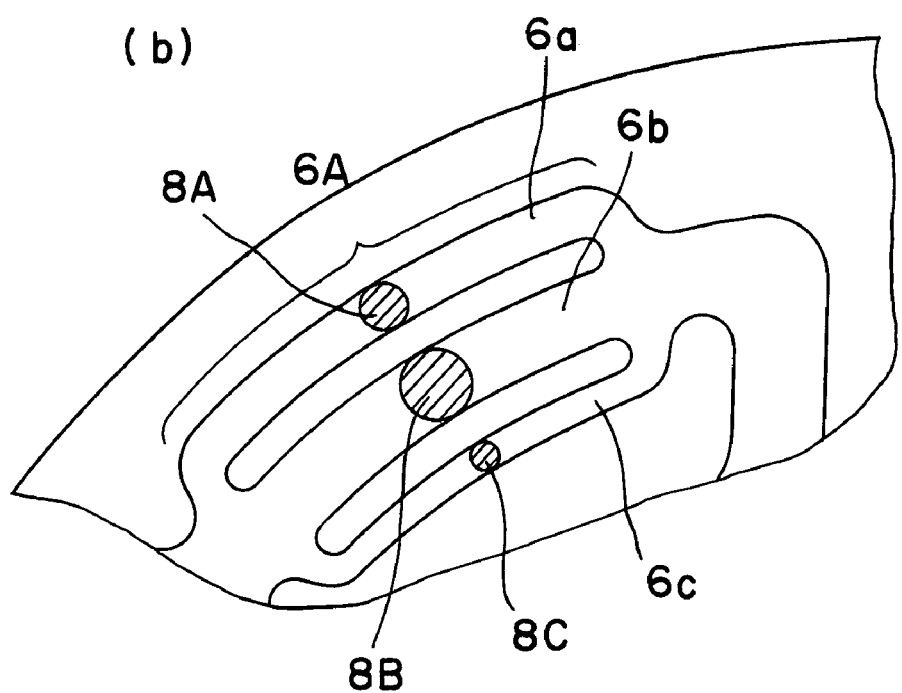

FIG. 5 is a plan view showing an example of pattern of a heating resistance 3A of a heater 1A according to the present embodiment. Parts already shown in FIG. 1 are referred to using the same numerals and the explanation may be omitted. According to the heater 1A of the present example, conductors 8A and 8B are set in heat generating parts 6a and 6b so that the parts 6a and 6b are electrically connected in parallel-connected portions 6A to 6J. A conductor 8C is removed from a heat generating part 6c, so that each heat generating part 6c is disconnected at the through hole 11 (refer to FIG. 6(a)). If a hot spot 21 on the heating face is observed, the heat generating part in a region direct under or near the hot spot 21 of the parallel-connected portion is selected and electrically connected. For example, as shown in FIG. 6 (b), the conductor 8C is inserted and fixed to the disconnected heat generating part 6c of the parallel-connected portion 6A to restore the electrical connection of the heat generating part 6c. The overall resistance value of the parallel-connected portion 6A is thus lowered and the heating value is also lowered in proportion to the reduction of the resistance value, so that the hot spot can be cancelled or reduced.

Examples of providing the resistance adjusting means in the heat generating part have been described. The following are examples of providing a parallel-connected portion without such resistance adjusting means.

Figure 7:
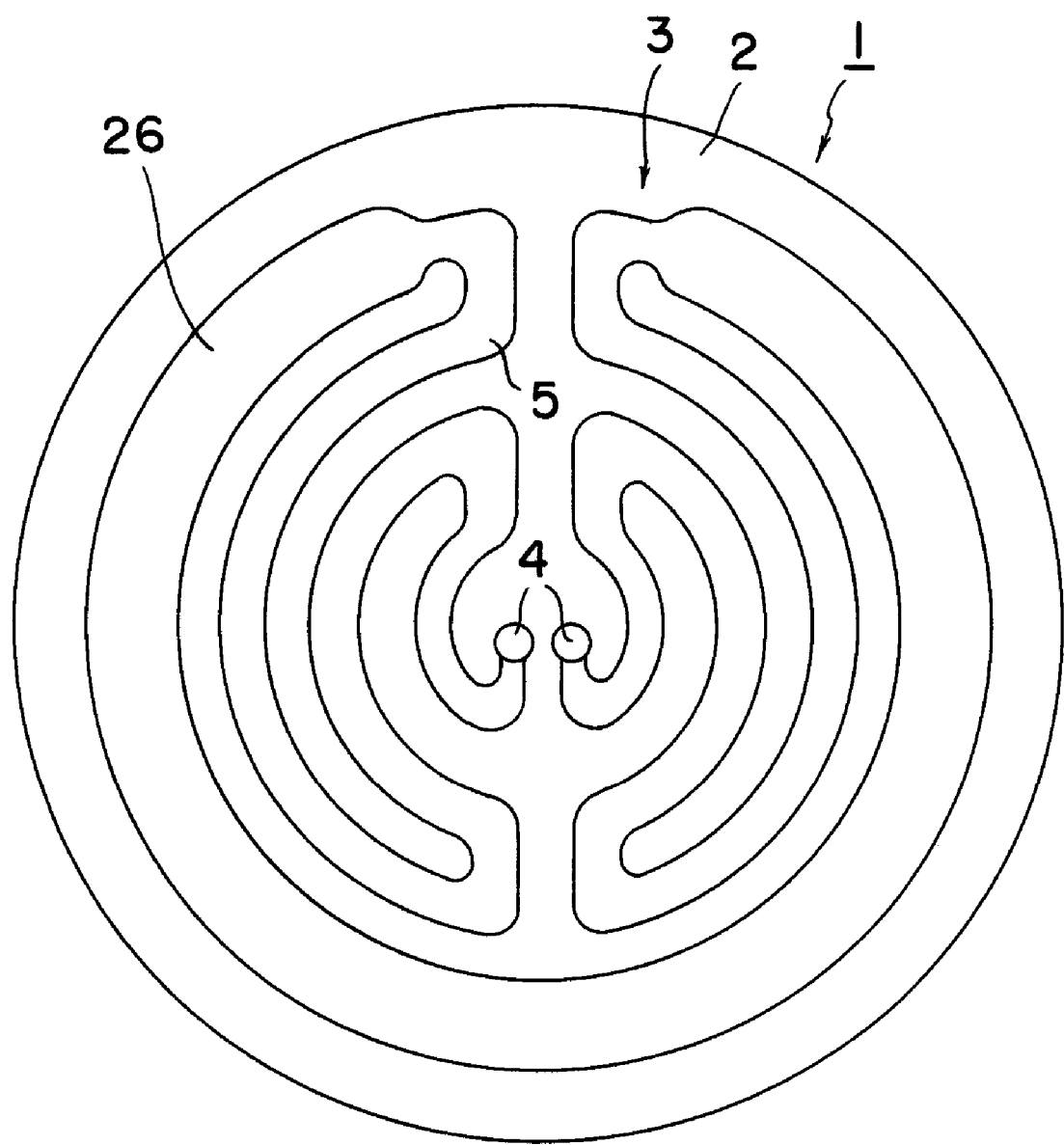
FIG. 7 is a comparative example showing a pattern including an arc-shaped heat generating part 26 on the peripheral part of a substrate 2.

In Comparative Example shown in FIG. 7, a serial-connected portion 26 is provided in the outermost peripheral portion of the substrate 2. In this case, if the width of the serial-connected portion 26 is too large, the heating value is lowered to lower the temperature in the peripheral portion of the heating face. It is thus necessary to increase the heating value from the peripheral portion of the heating face to sufficiently compensate for heat radiation from the edge of the substrate 2, by reducing the thickness of the parallel-connected portion 26. If the thickness of the serial-connected portion is reduced as described above, however, an arc-shaped hot spot tends to be observed on the heating face directly over the serial-connected portion.

Figure 8:
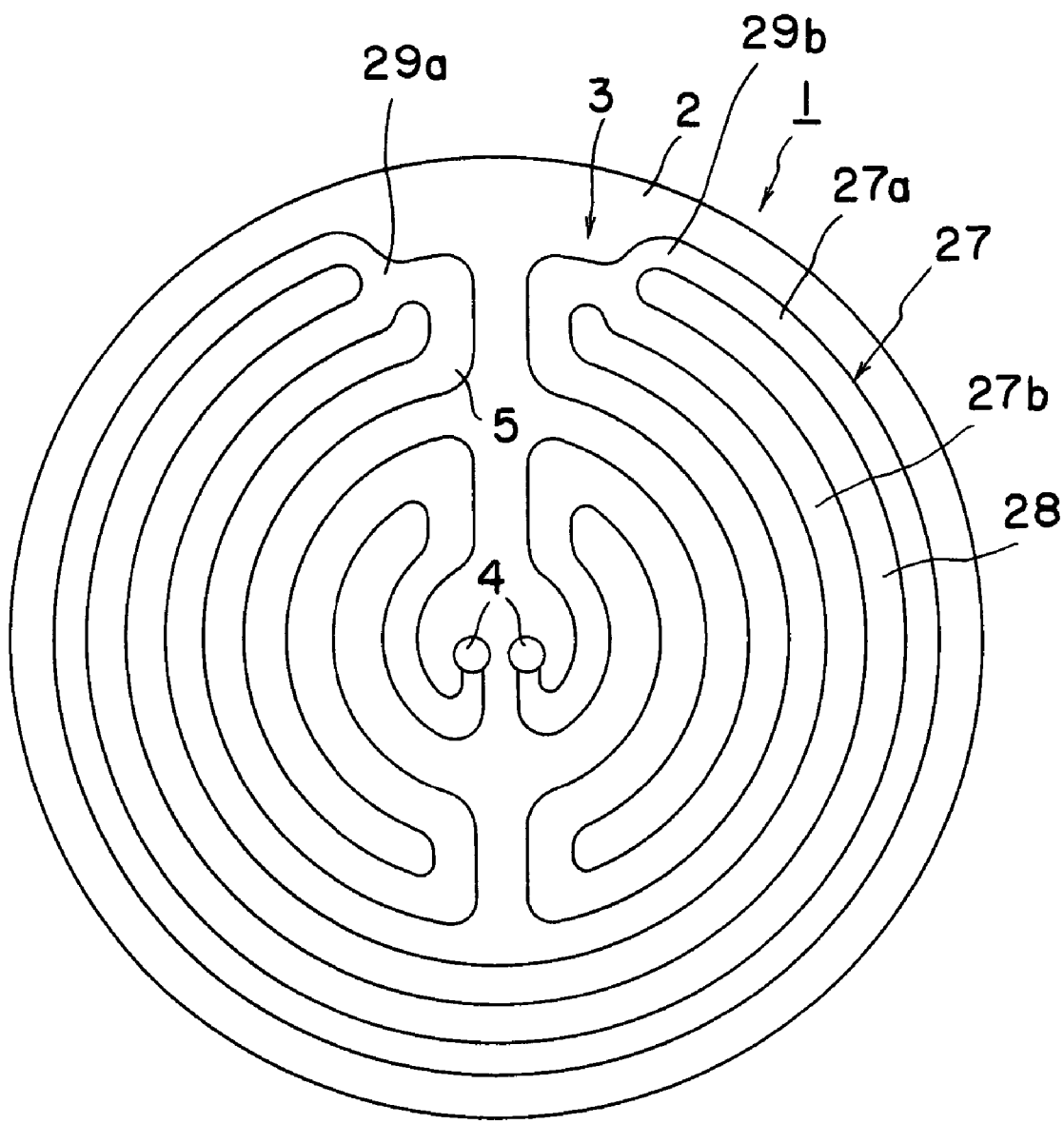
FIG. 8 is an inventive example showing a pattern including an arc-shaped heat generating part 27 on the peripheral part of a substrate 2.

On the other hand, according to the inventive example of FIG. 8, a parallel-connected portion 27 is provided in the outermost peripheral portion of the substrate 2. The parallel-connected portion 27 has a pair of arc-shaped heat generating parts 27a and 27b extending between a pair of cross points 29a and 29b. An elongate gap 28 is formed between the heat generating parts 27a and 27b. Even if the overall heating value from the parallel-connected portion 27 is made substantially the same as that of the serial-connected portion 26, in this case, the heat is generated from a plurality of the heat generating parts 27a and 27b. In this manner, the heating value generated from one heat generating line is reduced to the half in the parallel-connected portion 26, so that arc-shaped hot spots can be reduced or prevented on the heating face.

The heater of the present invention may be subjected to 2-zone control or multi-zone control, including three or more control zones.

The substrate for the heater may be made of a ceramic material or the other insulating materials which are not particularly limited. The material of the substrate is preferably a nitride ceramic such as aluminum nitride, silicon nitride, boron nitride and sialon, or another ceramic such as an alumina-silicon carbide composite material. Aluminum nitride or alumina is most preferred for obtaining excellent anti-corrosion property against a corrosive gas such as a halogen-based gas.

The shape of the substrate is not particularly limited and is preferably a disk. Pocket shaped parts, emboss-shaped parts, or grooves may be formed on the heating face for mounting a semiconductor. The process of manufacturing the substrate is not particularly limited and includes hot pressing or hot isostatic pressing, for example.

The shape of the heating resistance may be a coil, ribbon, mesh, plate or film. The material of the heating resistance is preferably a high melting point metal such as tantalum, tungsten, molybdenum, platinum, rhenium, hafnium or the alloys of these metals. In particular, when the ceramic substrate is made of aluminum nitride, the material of the heating resistance is preferably pure molybdenum or an alloy containing molybdenum. The material of the heating resistance may be a conductive material such as carbon, TiN or TiC, other than the high melting point metals described above.

Further, applications for the heater according to the present invention are not particularly limited, and the heater is preferably used in a semiconductor producing system. Such a system means a system usable in a wide variety of semiconductor processing in which metal contamination of a semiconductor is to be avoided. Such systems include film forming, etching, cleaning and testing systems.

As described above, the present invention provides a heater having an insulating substrate and a heating resistance so that the temperature on the heating face can be easily controlled without need to provide a temperature controlling member that is separate from the insulating substrate. Cold and hot spots on the heating face can be thus prevented.

The present invention has been explained referring to the preferred embodiments. However, the present invention is not limited to the illustrated embodiments which are given by way of examples only, and may be carried out in various modes without departing from the scope of the invention.

The invention claimed is:

1. A heater comprising an insulating substrate and a heating resistance provided in or on said substrate, said heating resistance comprising at least one parallel-connected portion comprising a plurality of heat generating parts connected in parallel with each other, and further comprising a retractable conductor in contact with at least one of said heat generating parts to allow for control of current flowing through said at least one of said heat generating parts.

2. The heater of claim 1, wherein at least one of said heat generating parts has an adjusted resistance value.

3. The heater of claim 1, wherein said heating resistance comprises a plurality of said at least one parallel-connected portions.

4. The heater of claim 1, wherein said retractable conductor is removable from and attachable to said insulating substrate.

5. The heater of claim 4, wherein said heating resistance comprises a plurality of said at least one parallel-connected portions.

6. The heater of claim 5, wherein said heat generating parts have a different resistance value from each other.

7. The heater of claim 5, wherein said insulating substrate comprises a ceramic material and wherein said heating resistance is embedded in said substrate.

8. The heater of claim 6, wherein said insulating substrate comprises a ceramic material and wherein said heating resistance is embedded in said substrate.

9. The heater of claim 4, wherein said heat generating parts have a different resistance value from each other.

10. The heater of claim 9, wherein said insulating substrate comprises a ceramic material and wherein said heating resistance is embedded in said substrate.

11. The heater of claim 4, wherein said insulating substrate comprises a ceramic material and wherein said heating resistance is embedded in said substrate.

12. The heater of claim 1, wherein said heat generating parts have a different resistance value from each other.

13. The heater of claim 1, wherein said insulating substrate comprises a ceramic material and wherein said heating resistance is embedded in said substrate.

14. The heater of claim 1, wherein a longitudinal axis of said retractable conductor intersects a plane of said at least one of said heat generating parts.

* * * * *